(12) United States Patent
Chiu et al.

(10) Patent No.: US 10,032,938 B1
(45) Date of Patent: Jul. 24, 2018

(54) SEMICONDUCTOR DEVICES AND METHODS FOR MANUFACTURING THE SAME

(71) Applicant: Vanguard International Semiconductor Corporation, Hsinchu (TW)

(72) Inventors: Chien-Wei Chiu, Beigang Township (TW); Shin-Cheng Lin, Tainan (TW); Yung-Hao Lin, Jhunan Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/723,802

(22) Filed: Oct. 3, 2017

(51) Int. Cl.
| | |
|---|---|
| *H01L 21/00* | (2006.01) |
| *H01L 29/872* | (2006.01) |
| *H01L 29/20* | (2006.01) |
| *H01L 21/322* | (2006.01) |
| *H01L 21/265* | (2006.01) |
| *H01L 21/02* | (2006.01) |
| *H01L 29/66* | (2006.01) |

(52) U.S. Cl.
CPC ........ *H01L 29/872* (2013.01); *H01L 21/0254* (2013.01); *H01L 21/2654* (2013.01); *H01L 21/3228* (2013.01); *H01L 29/2003* (2013.01); *H01L 29/66143* (2013.01)

(58) Field of Classification Search
None
See application file for complete search history.

(56) References Cited

FOREIGN PATENT DOCUMENTS

| CN | 104518014 A | 4/2015 |
| TW | 201338130 A | 9/2013 |
| TW | 201613091 A | 4/2016 |

*Primary Examiner* — Reema Patel
(74) *Attorney, Agent, or Firm* — Birch, Stewart, Kolasch & Birch, LLP

(57) ABSTRACT

A semiconductor device includes a first gallium nitride layer disposed on a semiconductor substrate, wherein the first gallium nitride layer has a first conductivity type. The semiconductor device also includes a second gallium nitride layer disposed on the first gallium nitride layer, wherein the second gallium nitride layer has the first conductivity type, and the first gallium nitride layer has a dopant concentration which is greater than that of the second gallium nitride layer. The semiconductor device further includes an anode electrode disposed on the second gallium nitride layer, a cathode electrode disposed on and in direct contact with the first gallium nitride layer, and an insulating region disposed on and in direct contact with the first gallium nitride layer, wherein the insulating region is located between the cathode electrode and the second gallium nitride layer.

20 Claims, 5 Drawing Sheets

SEMICONDUCTOR DEVICES AND METHODS FOR MANUFACTURING THE SAME

BACKGROUND

Field of the Invention

The invention relates to semiconductor devices, and in particular to semi-vertical semiconductor devices and methods for forming the same.

Description of the Related Art

In the semiconductor industry, semiconductor devices can be divided into horizontal structures and vertical structures according to the directions of electric current. Horizontal semiconductor devices have lower die costs than vertical semiconductor devices. However, the current density (i.e. the electric current per unit area) of horizontal semiconductor devices may be decreased because they are easily affected by the current crowding effect.

Moreover, in the past decades, progress in semiconductor devices and manufacturing technology has allowed the circuits to become smaller and more complicated. To shrink the size of elements and reduce the cost of processing at the same time, the current density of a semiconductor device needs to be improved, and this is the current issue.

BRIEF SUMMARY

Embodiments of semiconductor devices and methods for manufacturing the same are provided, in particular to a semi-vertical Schottky diode. In the past, the horizontal gallium nitride Schottky diodes were easily affected by the current crowding effect, which causes a decrease in current density (i.e. the electric current per unit area). To increase the current densities of the gallium nitride Schottky diodes, some embodiments of the disclosure dispose a first gallium nitride layer on the semiconductor substrate, and dispose a second gallium nitride layer on the first gallium nitride layer. The first gallium nitride layer and the second gallium nitride layer have the same conductivity type, such as n-type, and the first gallium nitride layer has a dopant concentration that is greater than that of the second gallium nitride layer.

In addition, in a gallium nitride Schottky diode provided in some embodiments of the disclosure, the bottom surface of the cathode electrode is disposed lower than the bottom surface of the anode electrode, such that the entire gallium nitride Schottky diode has a semi-vertical structure, which is different from the previous structures of two-dimensional electron gas (2DEG) generated by the energy band gap difference due to the dissimilarity of materials. In some embodiments of the disclosure, differences in dopant concentrations cause the electric currents of the gallium nitride Schottky diodes to flow downward vertically, and then to flow into the cathode electrodes which have lower bottom surfaces. Therefore, in some embodiments of the disclosure, the problem of the current crowding effect of horizontal structures can be overcome by the foregoing semi-vertical structures, and the current density can be increased efficiently.

Moreover, in some embodiments of the disclosure, gallium nitride is used to manufacture the Schottky diodes. In comparison with the silicon carbide Schottky diodes, the embodiments of the disclosure have the advantage of lower die costs.

Some embodiments of the disclosure provide a semiconductor device. The semiconductor device includes a first gallium nitride layer disposed on a semiconductor substrate, wherein the first gallium nitride layer has a first conductivity type. The semiconductor device also includes a second gallium nitride layer disposed on the first gallium nitride layer, wherein the second gallium nitride layer has the first conductivity type, and the first gallium nitride layer has a dopant concentration which is greater than that of the second gallium nitride layer. The semiconductor device further includes an anode electrode disposed on the second gallium nitride layer, and a cathode electrode disposed on the first gallium nitride layer, wherein the cathode electrode is in direct contact with the first gallium nitride layer. In addition, the semiconductor device includes an insulating region disposed on the first gallium nitride layer, wherein the insulating region is in direct contact with the first gallium nitride layer, and the insulating region is located between the cathode electrode and the second gallium nitride layer.

Some embodiments of the disclosure provide a method for forming a semiconductor device. The method includes forming a first gallium nitride layer on a semiconductor substrate, wherein the first gallium nitride layer has a first conductivity type. The method also includes forming a second gallium nitride layer on the first gallium nitride layer, wherein the second gallium nitride layer has the first conductivity type, and the first gallium nitride layer has a dopant concentration which is greater than that of the second gallium nitride layer. The method further includes forming an anode electrode on the second gallium nitride layer, and forming a cathode electrode on the first gallium nitride layer, wherein the cathode electrode is in direct contact with the first gallium nitride layer. In addition, the method includes forming an insulating region on the first gallium nitride layer, wherein the insulating region is in direct contact with the first gallium nitride layer, and the insulating region is located between the cathode electrode and the second gallium nitride layer.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
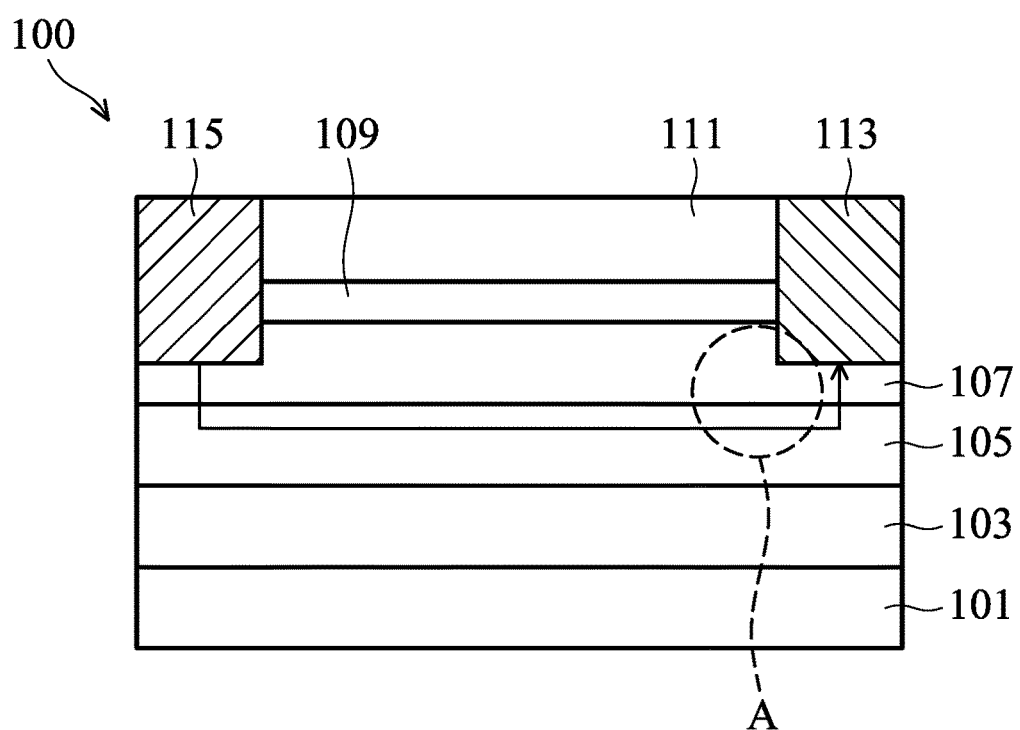
FIG. 1 is a cross-sectional view illustrating a comparative semiconductor device.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

FIG. 1 is a cross-sectional view illustrating a comparative semiconductor device 100. As shown in FIG. 1, the semiconductor device 100, such as a gallium nitride Schottky diode having a horizontal structure, includes a semiconductor substrate 101, a buffer layer 103 disposed on the semiconductor substrate 101, a gallium nitride layer 105 disposed on the buffer layer 103, an aluminum gallium nitride layer 107 disposed on the gallium nitride layer 105, a capping layer 109 disposed on the aluminum gallium nitride layer 107, and a passivation layer 111 disposed on the capping layer 109. Moreover, the semiconductor device 100 also includes a cathode electrode 113 and an anode electrode 115 disposed on the aluminum gallium nitride layer 107, wherein the cathode electrode 113 and the anode electrode 115 extend into the aluminum gallium nitride layer 107. That is, the bottom surfaces of the cathode electrode 113 and the anode electrode 115 are lower than the top surface of the aluminum gallium nitride layer 107.

As shown in FIG. 1, the electric current of the semiconductor device 100 flows from the anode electrode 115 to the gallium nitride layer 105 (the gallium nitride layer 105 is equivalent to the channel layer of the semiconductor device 100) by passing through the aluminum gallium nitride layer 107 under the anode electrode 115. Next, the electric current flows horizontally though the surface of the gallium nitride layer 105 which is close to the aluminum gallium nitride layer 107, and then, the electric current flows into the cathode electrode 113 by passing through the aluminum gallium nitride layer 107 under the cathode electrode 113.

The electric current carried by two-dimensional electron gas (2DEG) of the semiconductor device 100 is generated by the energy band gap difference due to the dissimilarity of materials, such as the materials of the gallium nitride layer 105 and the aluminum gallium nitride layer 107. In the foregoing horizontal structure, the current crowding effect may occur at the corner of the cathode electrode 113 which is close to the anode electrode 115 and the aluminum gallium nitride layer 107 (i.e. the A region shown in FIG. 1). Therefore, the problem of low current density (i.e. the electric current per unit area) of the semiconductor device 100, such as the gallium nitride Schottky diode having the horizontal structure, needs to be overcome.

FIGS. 2A to 2D are cross-sectional views illustrating an exemplary sequential forming process of a semiconductor device 200 in accordance with some embodiments.

Figure 2A:
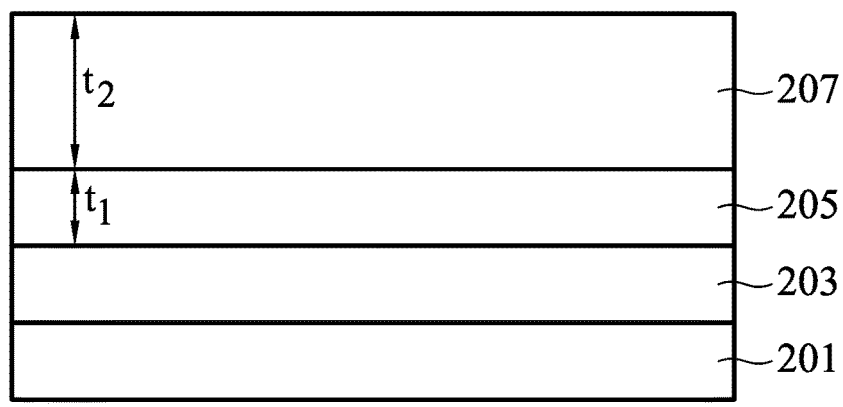
FIGS. 2A to 2D are cross-sectional views illustrating an exemplary sequential forming process of a semiconductor device in accordance with some embodiments.

As shown in FIG. 2A, a semiconductor substrate 201 is provided, in accordance with some embodiments. In some embodiments, the semiconductor substrate 201 may be formed by silicon (Si), silicon carbide (SiC), gallium nitride (GaN), silicon dioxide ($SiO_2$), sapphire, or a combination thereof. In addition, the semiconductor substrate 201 may be a lightly doped p-type or n-type substrate.

Next, a seed layer (not shown) is formed on the semiconductor substrate 201, and a buffer layer 203 is formed on the seed layer. In some embodiments, the seed layer and the buffer layer 203 are formed by metal organic chemical vapor deposition (MOCVD), molecular beam epitaxy (MBE), or a combination thereof. The seed layer may be made of aluminium nitride (AlN), aluminium oxide ($Al_2O_3$), aluminum gallium nitride (AlGaN), silicon carbide (SiC), aluminium (Al), or a combination thereof, and the seed layer 102 can be a single-layer or a multi-layer structure.

Furthermore, the material of the buffer layer 203 is decided by the material of the seed layer and the gas introduced during the epitaxial process. In some embodiments, the buffer layer 203 may be made of aluminium nitride (AlN), gallium nitride (GaN), aluminum gallium nitride (AlGaN), indium aluminium gallium nitride (InAlGaN), or a combination thereof. In some embodiments, the buffer layer 203 may be a multi-layer structure doped with carbon (C), silicon (Si), magnesium (Mg) or iron (Fe). In some embodiments, the thickness of the buffer layer 203 is in a range from about 1 μm to about 20 μm.

Still referring to FIG. 2A, a first gallium nitride layer 205 is formed on the buffer layer 203, and a second gallium nitride layer 207 is formed on the first gallium nitride layer 205. It should be noted that the first gallium nitride layer 205 and the second gallium nitride layer 207 are doped with N-type dopants, such as phosphorous (P) or arsenic (As), and the dopant concentration of the first gallium nitride layer 205 is higher than the dopant concentration of the second gallium nitride layer 207. In some embodiments, the dopant concentration of the first gallium nitride layer 205 is about $1 \times 10^{19}$ atoms/$cm^3$ or more, and the dopant concentration of the second gallium nitride layer 207 is in a range from about $1 \times 10^{15}$ atoms/$cm^3$ to about $1 \times 10^{18}$ atoms/$cm^3$.

In some embodiments, the thickness $t_2$ of the second gallium nitride layer 207 is greater than the thickness $t_1$ of the first gallium nitride layer 205. In other embodiments, the thickness $t_2$ of the second gallium nitride layer 207 may be smaller than or equal to the thickness $t_1$ of the first gallium nitride layer 205.

Figure 2B:
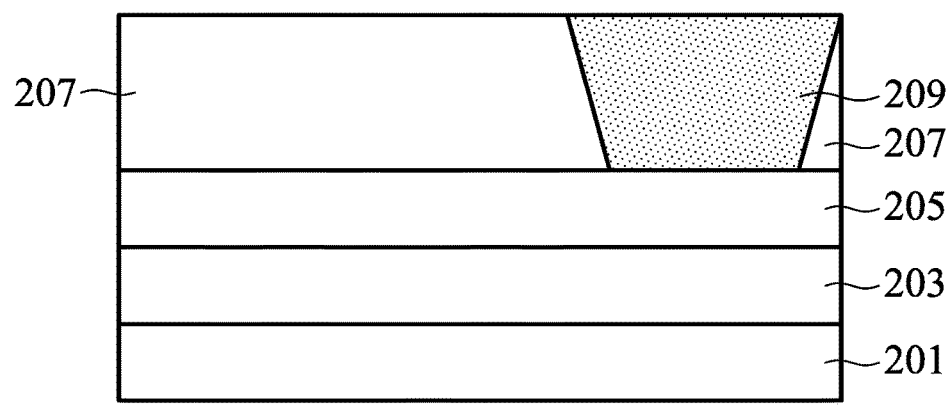

As shown in FIG. 2B, according to some embodiments, an implant isolation process is performed to implant oxygen ions into a portion of the second gallium nitride layer 207, such that the portion of the second gallium nitride layer 207 can be transformed into an insulating material 209. In some embodiments, the insulating material 209 is made of the same material as the second gallium nitride layer 207 doped with oxygen ions. In other embodiments, other heavy ions can be used in the implant isolation process, such as argon ions.

Figure 2C:
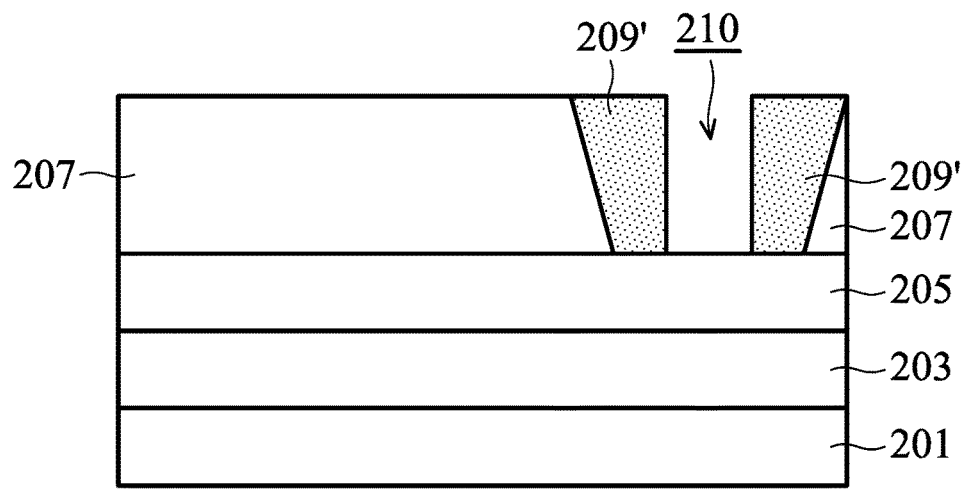

Next, as shown in FIG. 2C, an opening 210 is formed in the insulating material 209 to expose a portion of the first gallium nitride layer 205. In some embodiments, the opening 210 can be formed by a photolithography process and an etching process, and the etching process may include a dry etching or a wet etching. After the opening 210 is formed, the remaining portion of the insulating material 209 becomes the insulating region 209'.

Figure 2D:
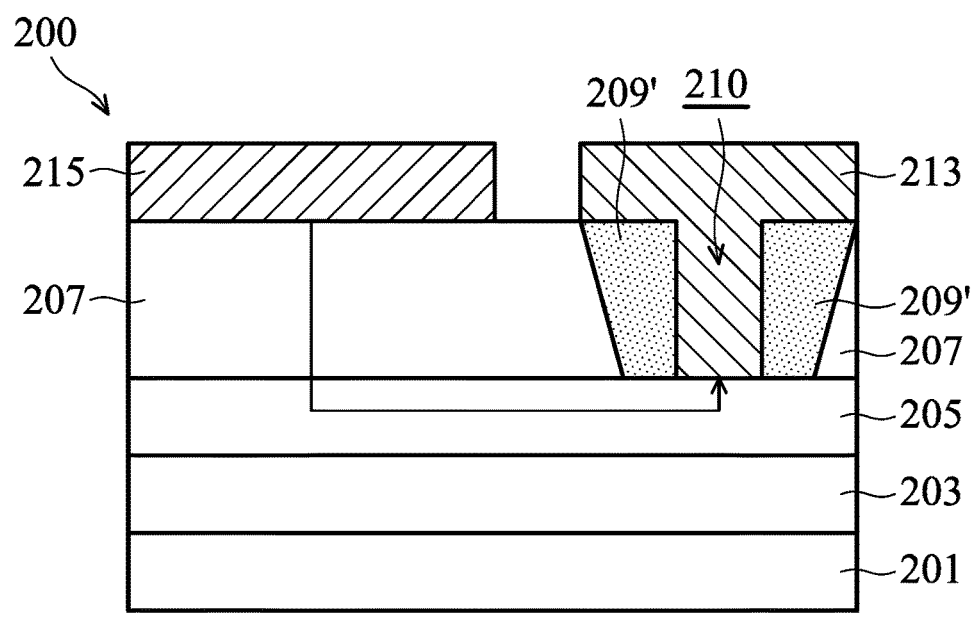

As shown in FIG. 2D, according to some embodiments, a cathode electrode 213 is formed in the opening 210. The cathode electrode 213 is located on the first gallium nitride layer 205 and is in direct contact with the first gallium nitride layer 205. Moreover, an anode electrode 215 is formed on the second gallium nitride layer 207. Specifically, the insulating region 209' is located between the cathode electrode 213 and the second gallium nitride layer 207, and the cathode electrode 213 is surrounded by the insulating region 209'. As a result, the cathode electrode 213 is separated from the second gallium nitride layer 207. In addition, the bottom surface of the cathode electrode 213 is lower than the bottom surface of the anode electrode 215.

In some embodiments, as shown in FIG. 2D, the cathode electrode 213 extends onto the insulating region 209' located on both sides of the cathode electrode 213, and the top surface of the cathode electrode 213 is higher than the top surface of the second gallium nitride layer 207. In other embodiments, the cathode electrode 213 does not extend onto the insulating region 209' located on both of its sides, and the top surface of the cathode electrode 213 is level with the top surface of the second gallium nitride layer 207.

In some embodiments, the cathode electrode 213 and the anode electrode 215 are formed by chemical vapor deposition (CVD), physical vapor deposition (PVD), atomic layer deposition (ALD), electroplating, sputtering, or another applicable method. In addition, the cathode electrode 213 and the anode electrode 215 may include metal materials.

It should be noted that the anode electrode 215 may be formed by a metal material which has a higher metal work function than that of the cathode electrode 213. As a result, the cathode electrode 213 and the first gallium nitride layer 205 have an Ohmic contact formed therebetween, and the anode electrode 215 and the second gallium nitride layer 207 have a Schottky contact formed therebetween. For example, the cathode electrode 213 may be made of titanium (Ti), aluminum (Al), or a combination thereof, and the anode electrode 215 may be made of nickel (Ni), gold (Au), or a combination thereof.

Still referring to FIG. 2D, the electric current of the semiconductor device 200 flows from the anode electrode 215 and passes through the second gallium nitride layer 207 under the anode electrode 215 vertically. Next, the electric current horizontally passes through the surface of the first gallium nitride layer 205 which is close to the second gallium nitride layer 207, and then, the electric current flows into the cathode electrode 213. Since the semiconductor device 200 has a semi-vertical structure, the problem of the current crowding effect of horizontal structures can be efficiently overcome. As a result, the current density can be increased.

FIGS. 3A to 3D are cross-sectional views illustrating an exemplary sequential forming process of a semiconductor device 300 in accordance with some other embodiments.

Figure 3A:
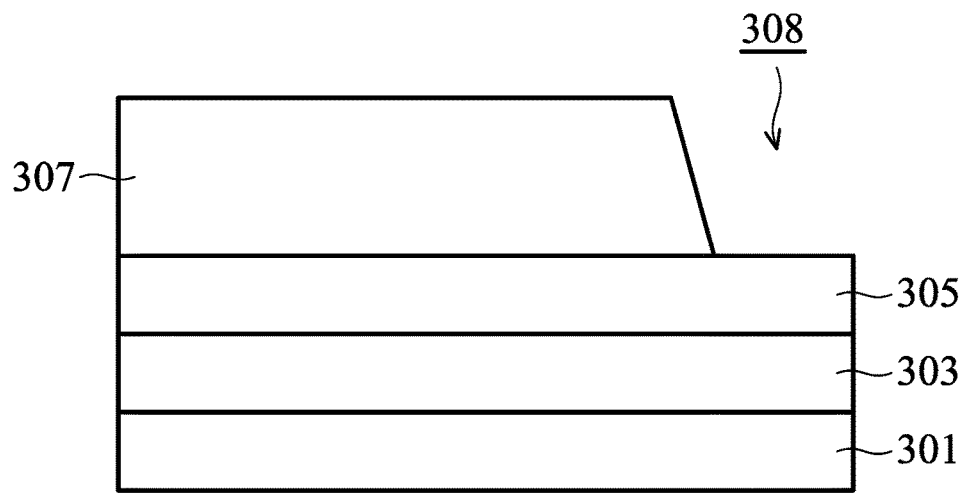
FIGS. 3A to 3D are cross-sectional views illustrating an exemplary sequential forming process of a semiconductor device in accordance with some other embodiments.

As shown in FIG. 3A, a buffer layer 303, a first gallium nitride layer 305 and a second gallium nitride layer 307 are formed sequentially on a semiconductor substrate 301. A first recess 308 is formed in the second gallium nitride layer 307, and a portion of the first gallium nitride layer 305 is exposed by the first recess 308. In some embodiments, the first recess 308 may be formed by a photolithography process and an etching process, and the etching process may include dry etching or wet etching. The materials and processes used to form the semiconductor substrate 301, the buffer layer 303, the first gallium nitride layer 305 and the second gallium nitride layer 307 are similar to, or the same as, those used to form the semiconductor substrate 201, the buffer layer 203, the first gallium nitride layer 205 and the second gallium nitride layer 207 of FIG. 2A, and are not repeated herein.

Figure 3B:
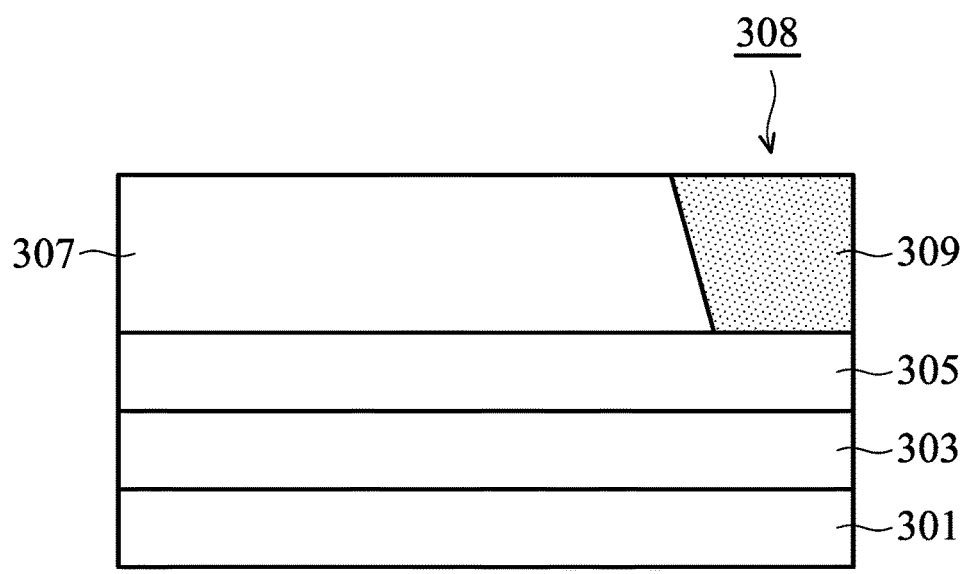

As shown in FIG. 3B, an insulating material 309 is filled in the first recess 308, in accordance with some embodiments. The insulating material 309 is formed by chemical vapor deposition (CVD), physical vapor deposition (PVD), atomic layer deposition (ALD), high density plasma chemical vapor deposition (HDPCVD), metal organic chemical vapor deposition (MOCVD), plasma enhanced chemical vapor deposition (PECVD), or a combination thereof.

It should be noted that the insulating material 309 of the semiconductor device 300 is not transformed from the material of the second gallium nitride layer 307, which is different from the semiconductor device 200. In some embodiments, the insulating material 309 may include silicon oxide, silicon nitride, silicon oxynitride, a combination thereof, or another applicable insulating material. Moreover, after filling the first recess 308 with the insulating material 309, a planarization process, such as a chemical mechanical polishing (CMP) process, may be performed optionally to remove the insulating material 309 located on the second gallium nitride layer 307.

Figure 3C:
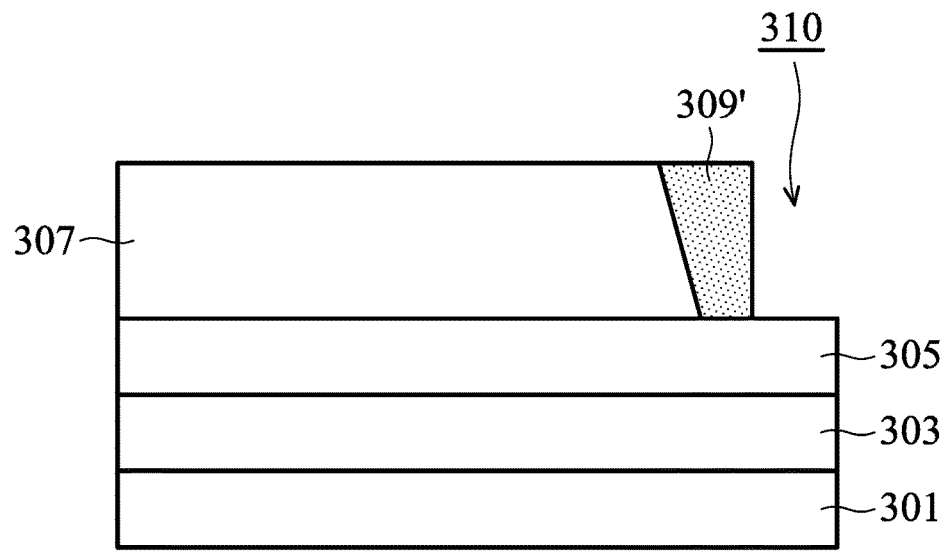

Next, as shown in FIG. 3C, a portion of the insulating material 309 is removed to form a second recess 310 in the insulating material 309. A portion of the first gallium nitride layer 305 is exposed by the second recess 310, and an insulating region 309' is formed by the remaining insulating material 309. In some embodiments, the forming processes of the second recess 310 may be similar to, or the same as, those used to form the first recess 308 and are not repeated herein.

Figure 3D:
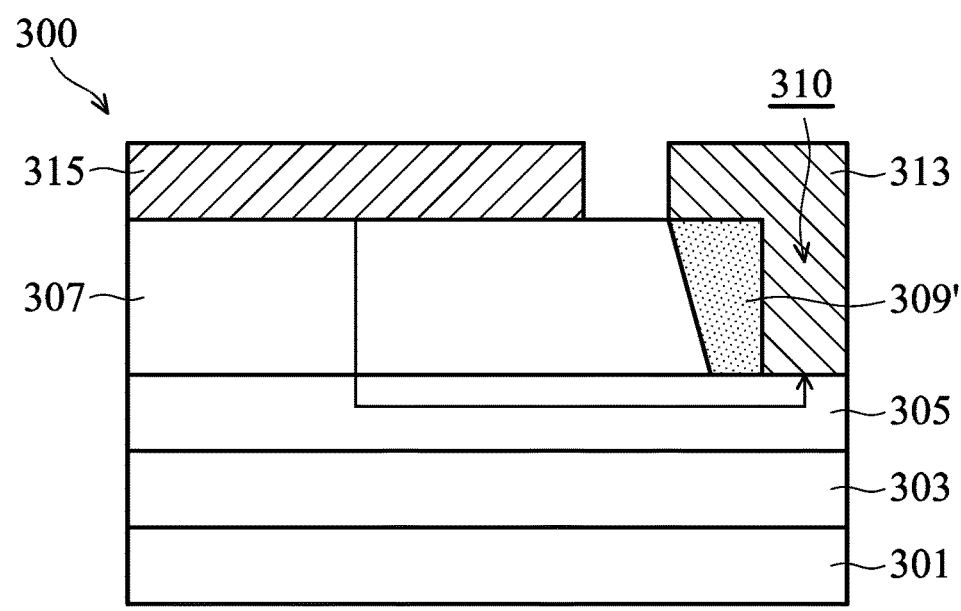

As shown in FIG. 3D, according to some embodiments, a cathode electrode 313 is formed in the second recess 310, and the cathode electrode 313 is located on the first gallium nitride layer 305 and is indirect contact with the first gallium nitride layer 305. Moreover, an anode electrode 315 is formed on the second gallium nitride layer 307. Specifically, the insulating region 309' is located between the cathode electrode 313 and the second gallium nitride layer 307, such that the cathode electrode 313 is separated from the second gallium nitride layer 307. In addition, the bottom surface of the cathode electrode 313 is lower than the bottom surface of the anode electrode 315.

In some embodiments, as shown in FIG. 3D, the cathode electrode 313 extends onto the insulating region 309', and the top surface of the cathode electrode 313 is higher than the top surface of the second gallium nitride layer 307. In other embodiments, the cathode electrode 313 does not extend onto the insulating region 309', and the top surface of the cathode electrode 313 is level with the top surface of the second gallium nitride layer 307.

In addition, the materials and processes used to form the cathode electrode 313 and the anode electrode 315 are similar to, or the same as, those used to form the above-mentioned cathode electrode 213 and the anode electrode 215, and are not repeated herein.

Still referring to FIG. 3D, the electric current of the semiconductor device 300 flows from the anode electrode 315 and passes through the second gallium nitride layer 307 under the anode electrode 315 vertically. Next, the electric current horizontally passes through the surface of the first gallium nitride layer 305 which is close to the second gallium nitride layer 307 and then flows into the cathode electrode 313. Since the semiconductor device 300 has a semi-vertical structure, the problem of the current crowding effect of horizontal structures can be efficiently overcome. As a result, the current density can be increased.

In the past, the horizontal gallium nitride Schottky diodes were easily affected by the current crowding effect, which causes a decrease in current density (i.e. the electric current per unit area). To increase the current densities of the gallium nitride Schottky diodes, some embodiments of the disclosure dispose a first gallium nitride layer on the semiconductor substrate, and dispose a second gallium nitride layer on the first gallium nitride layer. The first gallium nitride layer and the second gallium nitride layer have the same conductivity type, such as n-type, and the first gallium nitride layer has a dopant concentration that is greater than that of the second gallium nitride layer.

In addition, in a gallium nitride Schottky diode provided in some embodiments of the disclosure, the bottom surface of the cathode electrode is disposed lower than the bottom surface of the anode electrode, such that the entire gallium nitride Schottky diode has a semi-vertical structure, which is different from the previous structures of two-dimensional electron gas (2DEG) generated by the energy band gap difference due to the dissimilarity of materials. In some embodiments of the disclosure, differences in the dopant concentrations cause the electric currents of the gallium nitride Schottky diodes to flow downward vertically, and then to flow into the cathode electrodes which have lower bottom surfaces. Therefore, in some embodiments of the disclosure, the problem of the current crowding effect of horizontal structures can be overcome by the foregoing semi-vertical structures, and the current density can be increased efficiently.

Moreover, in some embodiments of the disclosure, gallium nitride is used to manufacture the Schottky diodes. In comparison with the silicon carbide Schottky diodes, the embodiments of the disclosure have the advantage of lower die costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gallium nitride layer disposed on a semiconductor substrate, wherein the first gallium nitride layer has a first conductivity type;
   a second gallium nitride layer disposed on the first gallium nitride layer, wherein the second gallium nitride layer has the first conductivity type, and the first gallium nitride layer has a dopant concentration which is greater than that of the second gallium nitride layer;
   an anode electrode disposed on the second gallium nitride layer;
   a cathode electrode disposed on the first gallium nitride layer, wherein the cathode electrode is in direct contact with the first gallium nitride layer; and
   an insulating region disposed on the first gallium nitride layer, wherein the insulating region is in direct contact with the first gallium nitride layer, and the insulating region is located between the cathode electrode and the second gallium nitride layer.

2. The semiconductor device as claimed in claim 1, wherein the first conductivity type is n-type.

3. The semiconductor device as claimed in claim 1, wherein the cathode electrode extends onto the insulating region.

4. The semiconductor device as claimed in claim 1, wherein the cathode electrode is surrounded by the insulating region.

5. The semiconductor device as claimed in claim 1, wherein the insulating region is made of the same material as the second gallium nitride layer doped with oxygen ions.

6. The semiconductor device as claimed in claim 1, wherein the second gallium nitride layer has a thickness which is greater than that of the first gallium nitride layer.

7. The semiconductor device as claimed in claim 1, wherein a Schottky contact is formed between the anode electrode and the second gallium nitride layer, and an Ohmic contact is formed between the cathode electrode and the first gallium nitride layer.

8. The semiconductor device as claimed in claim 1, further comprising:
   a buffer layer disposed between the semiconductor substrate and the first gallium nitride layer.

9. The semiconductor device as claimed in claim 1, wherein a bottom surface of the cathode electrode is lower than a bottom surface of the anode electrode.

10. The semiconductor device as claimed in claim 1, wherein a top surface of the cathode electrode is level with or higher than a top surface of the second gallium nitride layer.

11. A method for forming a semiconductor device, comprising:
    forming a first gallium nitride layer on a semiconductor substrate, wherein the first gallium nitride layer has a first conductivity type;
    forming a second gallium nitride layer on the first gallium nitride layer, wherein the second gallium nitride layer has the first conductivity type, and the first gallium nitride layer has a dopant concentration which is greater than that of the second gallium nitride layer;
    forming an anode electrode on the second gallium nitride layer;
    forming a cathode electrode on the first gallium nitride layer, wherein the cathode electrode is in direct contact with the first gallium nitride layer; and
    forming an insulating region on the first gallium nitride layer, wherein the insulating region is in direct contact with the first gallium nitride layer, and the insulating region is located between the cathode electrode and the second gallium nitride layer.

12. The method as claimed in claim 11, wherein the first conductivity type is n-type.

13. The method as claimed in claim 11, wherein the cathode electrode extends onto the insulating region.

14. The method as claimed in claim 11, wherein the forming the cathode electrode further comprises:
    forming a first recess in the second gallium nitride layer;
    filling the first recess with an insulating material;
    removing a portion of the insulating material, such that a second recess is formed in the insulating material, wherein the first gallium nitride layer is exposed by the second recess, and the insulating region is formed by a portion of the insulating material that remains; and
    forming the cathode electrode in the second recess.

15. The method as claimed in claim 11, wherein the forming the cathode electrode further comprises:
    performing an implant isolation process to transform a portion of the second gallium nitride layer into an insulating material;

forming an opening in the insulating material to expose the first gallium nitride layer and to form the insulating region; and forming the cathode electrode in the opening, wherein the cathode electrode is surrounded by the insulating region.

16. The method as claimed in claim 15, wherein the implant isolation process is performed by implanting oxygen ions into the portion of the second gallium nitride layer.

17. The method as claimed in claim 11, wherein the second gallium nitride layer has a thickness which is greater than that of the first gallium nitride layer.

18. The method as claimed in claim 11, wherein a Schottky contact is formed between the anode electrode and the second gallium nitride layer, and an Ohmic contact is formed between the cathode electrode and the first gallium nitride layer.

19. The method as claimed in claim 11, further comprising:

forming a buffer layer between the semiconductor substrate and the first gallium nitride layer.

20. The method as claimed in claim 11, wherein a bottom surface of the cathode electrode is lower than a bottom surface of the anode electrode, and a top surface of the cathode electrode is level with or higher than a top surface of the second gallium nitride layer.

* * * * *